(12) United States Patent
Yamada

(10) Patent No.: US 7,631,234 B2
(45) Date of Patent: Dec. 8, 2009

(54) TEST APPARATUS AND TEST METHOD

(75) Inventor: Tatsuya Yamada, Tokyo (JP)

(73) Assignee: Advantest Corporation, Tokyo (JP)

( * ) Notice: Subject to any disclaimer, the term of this patent is extended or adjusted under 35 U.S.C. 154(b) by 427 days.

(21) Appl. No.: 11/589,314

(22) Filed: Oct. 27, 2006

(65) Prior Publication Data

US 2007/0124638 A1 May 31, 2007

(30) Foreign Application Priority Data

Oct. 27, 2005 (JP) .............................. 2005-312616

(51) Int. Cl.
*G01R 31/28* (2006.01)
*G11C 29/00* (2006.01)
*G01R 31/26* (2006.01)
*H03K 19/00* (2006.01)

(52) U.S. Cl. .................... 714/724; 714/738; 714/744; 365/201; 324/765; 326/16

(58) Field of Classification Search ...................... None
See application file for complete search history.

(56) References Cited

U.S. PATENT DOCUMENTS

| | | | | |
|---|---|---|---|---|
| 5,321,700 A | * | 6/1994 | Brown et al. | 714/743 |
| 6,006,349 A | * | 12/1999 | Fujisaki | 714/738 |
| 6,032,282 A | * | 2/2000 | Masuda et al. | 714/744 |
| 6,058,057 A | * | 5/2000 | Ochiai et al. | 365/201 |
| 6,374,392 B1 | * | 4/2002 | Ochiai et al. | 716/6 |
| 6,553,529 B1 | * | 4/2003 | Reichert | 714/738 |
| 6,574,579 B1 | * | 6/2003 | Watanabe | 702/124 |
| 7,294,998 B2 | * | 11/2007 | Chiba | 324/158.1 |
| 2005/0001648 A1 | * | 1/2005 | Yamamoto | 324/772 |

* cited by examiner

*Primary Examiner*—Kevin L Ellis
*Assistant Examiner*—Guerrier Merant
(74) *Attorney, Agent, or Firm*—Osha • Liang LLP

(57) ABSTRACT

The present test apparatus avoids proximity restriction violation of an edge and surely generates a test signal. There is provided a test apparatus that tests a device under test. The test apparatus includes a test pattern generating section that generates a test pattern to test the device under test every test period, a plurality of edge generators that respectively generate an edge of a test signal to be supplied to the device under test based on the test pattern every cycle period of a reference clock that is used as a reference for an operation of this test apparatus, a selecting section that selects which edge generator generates each edge of a test signal to be output during the next cycle period based on a pattern of the edge generated during the current cycle period, and a test signal supplying section that supplies the test signal according to each edge generated from the selected edge generator to the device under test.

7 Claims, 14 Drawing Sheets

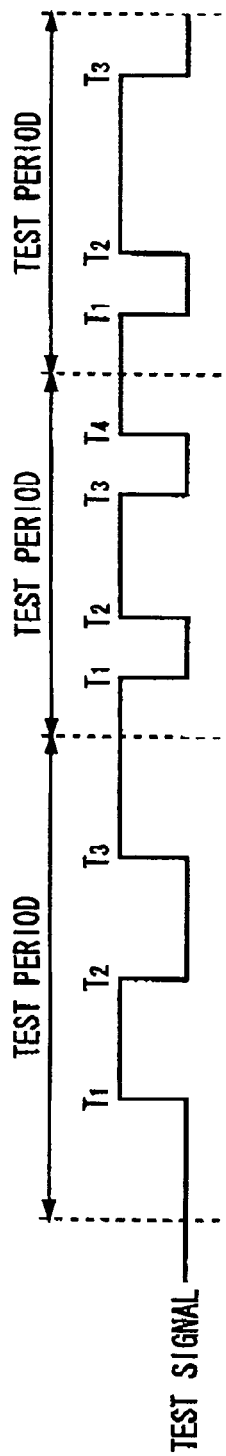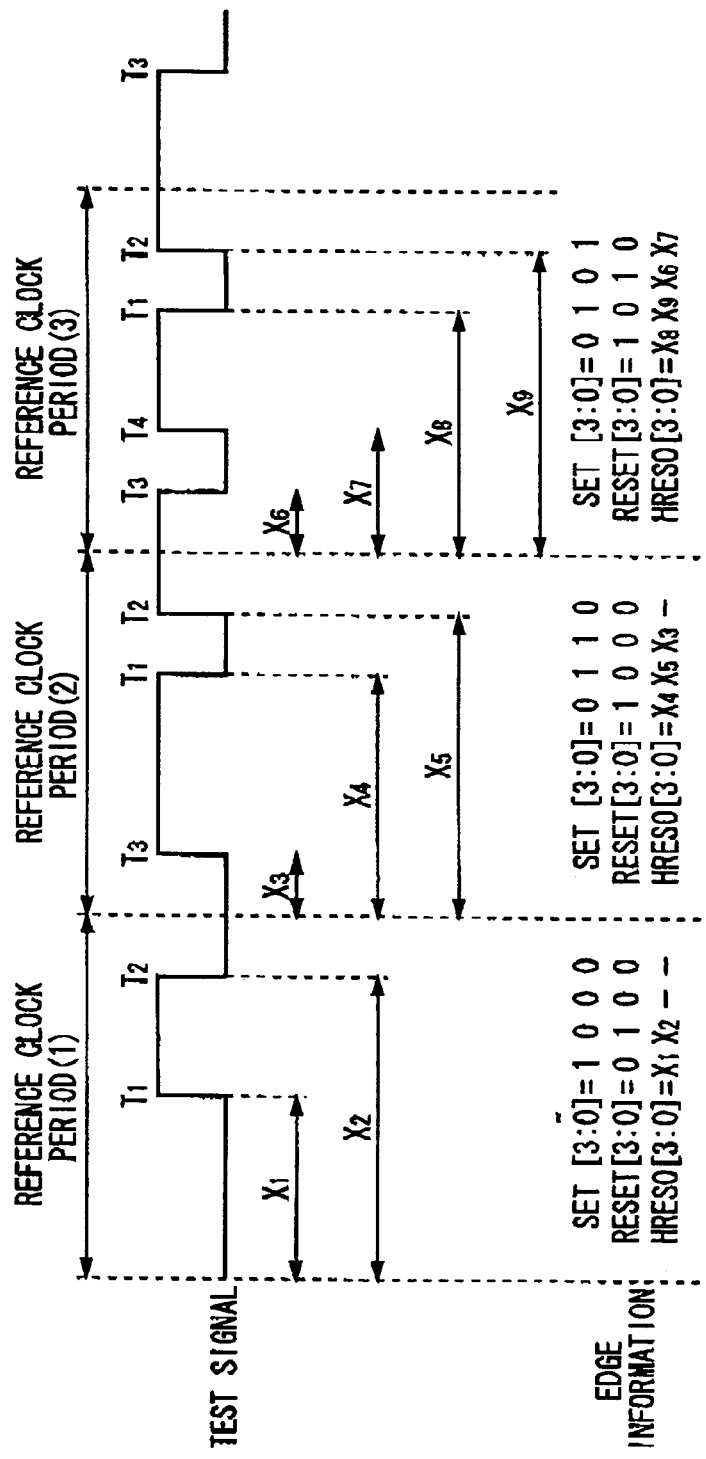

IN CASE OF ENDED_BY_SET

| INPUT | OUTPUT |
|---|---|
| !R!R!R!R | NNNN |
| !R!R!RR | NNNR |
| !R!RRN | NNRN |
| !R!RRS | NNRS |
| !RR!S!S | NRNN |
| !RR!SS | NRNS |
| !RRS!R | NRSN |
| !RRSR | NRSR |
| R!S!S!S | RNNN |
| R!S!SS | RNNS |
| R!SS!R | RNSN |
| R!SSR | RNSR |
| RS!R!R | RSNN |
| RS!RR | RSNR |
| RSR!S | RSRN |
| RSRS | RSRS |

FIG. 7

IN CASE OF ENDED_BY_RESET

| INPUT | OUTPUT |
|---|---|
| !S!S!S!S | NNNN |
| !S!S!SS | NNNS |
| !S!SSN | NNSN |
| !S!SSR | NNSR |
| !SS!R!R | NSNN |
| !SS!RR | NSNR |
| !SSR!S | NSRN |
| !SSRS | NSRS |
| S!R!R!R | SNNN |
| S!R!RR | SNNR |
| S!RR!S | SNRN |
| S!RRS | SNRS |
| SR!S!S | SRNN |
| SR!SS | SRNS |
| SRS!R | SRSN |
| SRSR | SRSR |

FIG. 8

IN CASE OF ODD

| SET B [3:0] | SET1 | SET2 |
|---|---|---|
| 1 1 X X | 1 | 2 |
| 1 X 1 X | 1 | 3 |
| 1 X X 1 | 1 | 4 |
| X 1 1 X | 2 | 3 |
| X 1 X 1 | 2 | 4 |
| X X 1 1 | 3 | 4 |
| 1 X X X | 1 | — |
| X 1 X X | 2 | — |
| X X 1 X | 3 | — |
| X X X 1 | 4 | — |
| others | — | — |

*FIG. 13*

IN CASE OF EVEN

| SET B [3:0] | SET1 | SET2 |
|---|---|---|
| 1 1 X X | 2 | 1 |
| 1 X 1 X | 3 | 1 |
| 1 X X 1 | 4 | 1 |
| X 1 1 X | 3 | 2 |
| X 1 X 1 | 4 | 2 |
| X X 1 1 | 4 | 3 |
| 1 X X X | — | 1 |
| X 1 X X | — | 2 |
| X X 1 X | — | 3 |
| X X X 1 | — | 4 |
| others | — | — |

*FIG. 14*

TEST APPARATUS AND TEST METHOD

CROSS REFERENCE TO RELATED APPLICATION

The present application claims priority from a Japanese Patent Application No. 2005-312616 filed on Oct. 27, 2005, the contents of which are incorporated herein by reference.

BACKGROUND

1. Field of the Invention

The present invention relates to a test apparatus and a test method. More particularly, the present invention relates to a test apparatus and a test method for a device under test such as a semiconductor device.

2. Related Art

A test apparatus for a semiconductor device or the like, for example, supplies a test signal with a predetermined level to the semiconductor device. The test apparatus includes a rising edge generator for generating a rising edge timing and a falling edge generator for generating a falling edge timing, and generates a test signal with a waveform according to the edge timings generated from these edge generators as disclosed, for example, in Japanese Patent Application Publication No. 1996-146099. Each edge generator generates an edge timing based on a delay time from a start time of a reference clock period that is a period for a reference clock and edge information showing an edge type.

An edge generator has a delay device with a variable delay time, and controls this delay device to generate an edge at a predetermined timing. The edge generator sets a delay amount of the delay device every reference clock period. For this reason, in order to generate a test signal including two rising edges and two falling edges during the reference clock period, a conventional test apparatus has included two edge generators for a rising edge and two edge generators for a falling edge to generate a prior edge and a subsequent edge from the edge generators different from each other.

In addition, since prior art documents are not recognized now, the description related to the prior art documents is omitted.

Meanwhile, the test apparatus converts a test pattern expressed in a unit of a test period set by a user into edge information every reference clock period, and generates the above test signal based on edge information after the conversion. Therefore, when a phase of the reference clock period for the test period deviates due to a fluctuation of the test period, it is necessary that the test apparatus makes the same edge generator generate two rising edges or two falling edges during the reference clock period depending on a generation timing of an edge even though the test apparatus has two rising edge generators and two falling edge generators. In this case, the test apparatus violates restriction (proximity restriction) that only one edge is generated from one edge generator during the reference clock period.

SUMMARY

Therefore, it is an object of some aspects of the present invention to provide a test apparatus and a test method that can solve the foregoing problems. The above and other objects can be achieved by combinations described in the independent claims. The dependent claims define further advantageous and exemplary combinations of the present invention.

According to the first aspect of the present invention, there is provided a test apparatus that tests a device under test. The test apparatus includes: a test pattern generating section that generates a test pattern to test the device under test every test period; a plurality of edge generators that respectively generate an edge of a test signal to be supplied to the device under test based on the test pattern every cycle period of a reference clock that is used as a reference for an operation of this test apparatus; a selecting section that selects which edge generator generates each edge of a test signal to be output during the next cycle period based on a pattern of the edge generated during the current cycle period; and a test signal supplying section that supplies the test signal according to each edge generated from the selected edge generator to the device under test.

The selecting section may select the edge generators so that the edge generators different from one another respectively generate two or more edges to be generated within the cycle period of the reference clock. The selecting section may include: a storing section that stores the edge generator for finally generating an edge during the current cycle period; and an interleaving section that selects the edge generator different from the edge generator stored on the storing section so that the different edge generator generates an initial edge during the next cycle period.

The selecting section may further include a sorting section that sorts a plurality of edges to be generated within the cycle period in time sequence to be generated, and the interleaving section may assign the edge generators that should generate each edge in a predetermined order in sequence from the next edge generator of the edge generator stored on the storing section.

The test apparatus may include the two edge generators for generating one edge every test period, the selecting section may make the storing section store the edge generator different from the edge generator stored on the storing section during the just precedent cycle period when odd-number edges are generated from the test pattern during the current cycle period, and the selecting section may hold a state in which the edge generator stored on the storing section during the just precedent cycle period is stored on the storing section when even-number edges are generated from the test pattern during the current cycle period.

The test apparatus may further includes: a plurality of set-side edge generators that respectively generate a rising edge for the test signal every cycle period; a plurality of reset-side edge generators that respectively generate a falling edge for the test signal every cycle period; and an edge erasing section that masks a rising edge or a falling edge so as not to generate this edge when a test pattern instructing that a rising edge is further generated in a high-level state of the test signal is supplied or when a test pattern instructing that a falling edge is further generated in a low-level state of the test signal is supplied, and the selecting section may select which edge generator generates each edge that should be output during the next cycle period and is not masked.

The edge erasing section may mask a rising edge and a falling edge so as not to generate these edges when a test pattern instructing that both this rising edge and this falling edge are generated at the same timing is supplied.

According to the second aspect of the present invention, there is provided a test method for testing a device under test. The test method includes: a test pattern generating step of generating a test pattern to test the device under test every test period; an edge generating step of respectively generating an edge of a test signal to be supplied to the device under test based on the test pattern by a plurality of edge generators every cycle period of a reference clock that is used as a reference for an operation of the test apparatus; a selecting step of selecting which edge generator generates each edge of a test signal to be output during the next cycle period based on a pattern of the edge generated during the current cycle period; and a test signal supplying step of supplying the test signal according to each edge generated from the selected edge generator to the device under test.

The summary does not necessarily describe all necessary features of the present invention. The present invention may also be a sub-combination of the features described above.

BRIEF DESCRIPTION OF THE DRAWINGS

The above and other objects and features and advantages of the present invention will become more apparent from the following description of the presently preferred exemplary embodiments of the invention taken in conjunction with the accompanying drawings, in which:

FIG. 3A is a view showing a test pattern generated every test period and FIG. 3B is a view showing edge information generated every reference clock period;

FIG. 7 is a view showing a translation table for erasing unnecessary edges referred to by a final edge storing section when a final edge at a just precedent reference clock period is a rising edge;

FIG. 8 is a view showing a translation table for erasing unnecessary edges referred to by a final edge storing section when a final edge at a just precedent reference clock period is a falling edge;

FIG. 13 is a view showing an input terminal selected by a switching selecting section for SET1 and a switching selecting section for SET2 in case of ODD state; and FIG. 14 is a view showing an input terminal selected by a switching selecting section for SET1 and a switching selecting section for SET2 in case of EVEN state.

DESCRIPTION OF EXEMPLARY EMBODIMENTS

The embodiments of the invention will now be described based on the preferred embodiments, which do not intend to limit the scope of the present invention, but just exemplify the invention. All of the features and the combinations thereof described in the embodiment are not necessarily essential to the invention.

Figure 1:
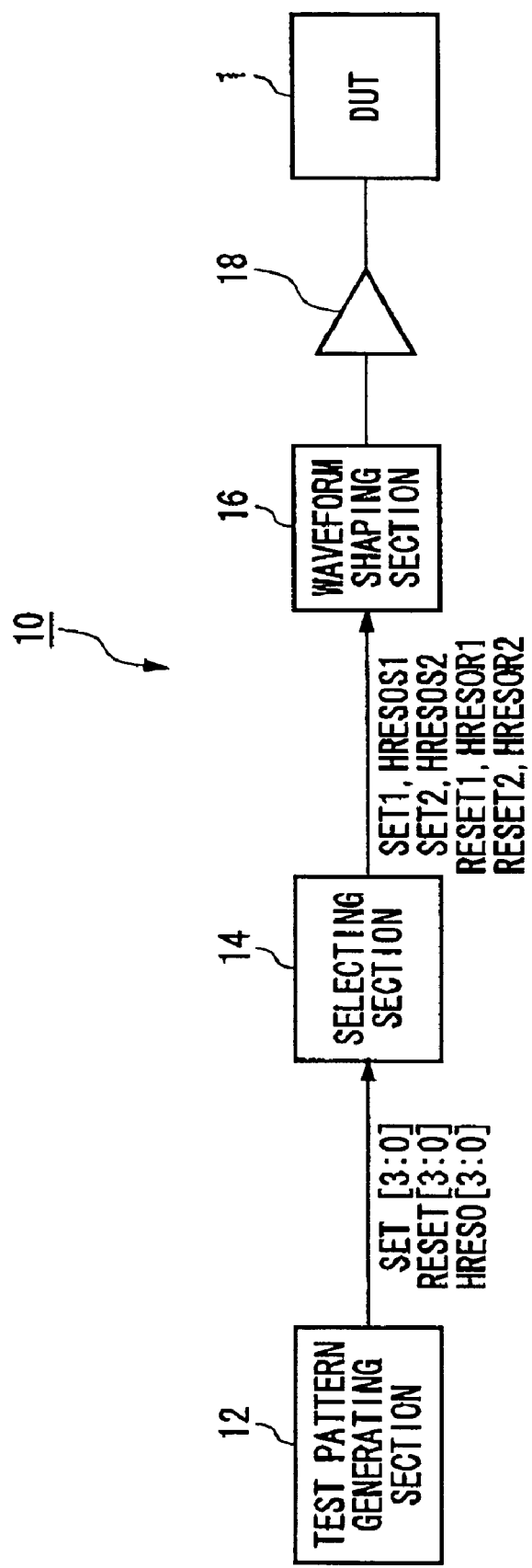
FIG. 1 is a view showing a configuration of a test apparatus of the present embodiment.

FIG. 1 is a view showing a configuration of a test apparatus 10 according to the present embodiment. The test apparatus 10 according to the present embodiment tests a device under test (hereinafter, referred to as a DUT 1) such as a semiconductor device. More specifically, the test apparatus 10 supplies a test signal including edges not more than four to the DUT 1 every cycle period (hereinafter, referred to as reference clock period) for a reference clock that acts as a reference for an operation of the test apparatus 10. According to the test apparatus 10, it is possible to reduce the generation of proximity restriction violation for edges and thus surely test the device under test.

The test apparatus 10 includes a test pattern generating section 12, a selecting section 14, a waveform shaping section 16, and a test signal supplying section 18. The test pattern generating section 12 generates a test pattern showing a waveform of a test signal to test the DUT 1 every test period that is a period set by a user. Furthermore, the test pattern generating section 12 converts the generated test pattern into edge information (SET[3:0], RESET[3:0], HRES0[3:0]) showing an edge timing in a reference clock period. The test pattern generating section 12 outputs this edge information every reference clock period.

The selecting section 14 receives edge information from the test pattern generating section 12 every reference clock period. The selecting section 14 determines which edge generator within the waveform shaping section 16 generates each edge included in the reference clock period based on the input edge information. At this time, the selecting section 14 selects which edge generator generates each edge in a test signal to be output during the next reference clock period based on the edge pattern generated during the current reference clock period, in order to evade proximity restriction violation. Then, the selecting section 14 supplies each one-bit edge generation flag (SET1, SET2, RESET1, and RESET2) and delay time information (HRESOS1, HRESOS2, HRESOR1, and HRESOR2) indicative of a delay time from a reference clock for each edge to each edge generator within the waveform shaping section 16, for each reference clock period.

The waveform shaping section 16 receives each edge generation flag and delay time information from the selecting section 14. The waveform shaping section 16 has a plurality of edge generators that respectively generates edges for a test signal to be supplied to the DUT 1 based on a test pattern every reference clock period, and generates a test signal based on edge timing generated from these edge generators. The test signal supplying section 18 supplies the test signal generated from the waveform shaping section 16 to the DUT 1.

Figure 2:
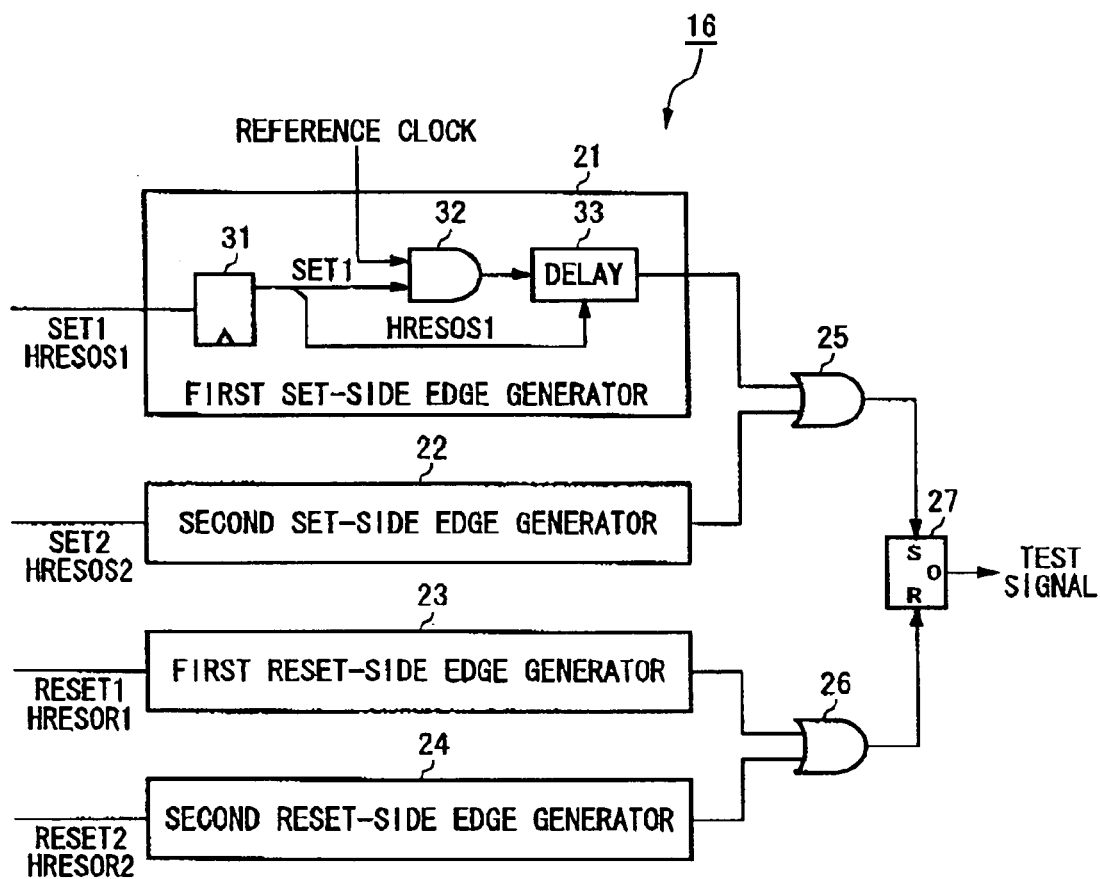
FIG. 2 is a view showing a concrete configuration of a waveform shaping section.

FIG. 2 is a view showing a concrete configuration of the waveform shaping section 16. The waveform shaping section 16 has a first set-side edge generator 21, a second set-side edge generator 22, a first reset-side edge generator 23, a second reset-side edge generator 24, a set-side OR circuit 25, a reset-side OR circuit 26, and a SR flip-flop circuit 27.

The first set-side edge generator 21 generates a rising edge of a test signal for each reference clock period based on an edge generation flag (SET1) and delay time information (HRESOS1). The second set-side edge generator 22 generates a rising edge of a test signal for each reference clock period based on an edge generation flag (SET2) and delay time information (HRESOS2). The first reset-side edge generator 23 generates a falling edge of a test signal for each reference clock period based on an edge generation flag (RESET1) and delay time information (HRESOR1). The second reset-side edge generator 24 generates a falling edge of a test signal for each reference clock period based on an edge generation flag (RESET2) and delay time information (HRESOR2).

Specifically, the first set-side edge generator 21 includes a first flip-flop 31, an AND logical operation circuit 32, and a delay element 33. The first flip-flop 31 stores the input edge generation flag (SET1) and delay time information (HRESOS1). The AND logical operation circuit 32 performs an AND logical operation on a reference clock and the edge generation flag (SET1). The delay element 33 delays and outputs an output signal from the AND logical operation circuit 32 by time shown by the delay time information (HRESOS1). In this way, the first set-side edge generator 21 can output a pulse showing an edge timing at a timing at which a delay time (HRESOS1) passes from start time of the reference clock period. In addition, since the second set-side edge generator 22, the first reset-side edge generator 23, and the second reset-side edge generator 24 have the same circuit configuration as that of the first set-side edge generator 21 even though signals to be input are different, their descriptions will be omitted.

The set-side OR circuit 25 performs an OR logical operation on output signals from the first set-side edge generator 21 and the second set-side edge generator 22, and inputs the result into a set terminal of the SR flip-flop circuit 27. The reset-side OR circuit 26 performs an OR logical operation on output signals from the first reset-side edge generator 23 and the second reset-side edge generator 24, and inputs the result into a reset terminal of the SR flip-flop circuit 27. The SR flip-flop circuit 27 raises a test signal output from an output terminal from a low level to a high level when a pulse has been input into the set terminal and lowers the test signal output from the output terminal from a high level to a low level when a pulse has been input into the reset terminal.

As described above, since the waveform shaping section 16 has two edge generators for a rising edge and two edge generators for a falling edge, a test signal including two rising edges and two falling edges can be output during one reference clock period.

FIG. 3A is a view showing a test pattern generated every test period and FIG. 3B is a view showing edge information generated every reference clock period. A test pattern is information specifying rising and fall timings (T1 to T4) every test period. A test period is arbitrarily set by a user.

The edge information includes one-bit rising edge position information (SET [3:0]) showing a presence or absence of a rising edge within a reference clock period, one-bit falling edge position information (RESET [3:0]) showing a presence or absence of a falling edge within the reference clock period, and predetermined-bit delay time information (HRESO [3:0]) showing a delay time of each edge within the reference clock period. In addition, one reference clock period includes four edges at a maximum. Therefore, in the specification, four information data included in one edge information are expressed by adding the array symbol [3:0] to the information (SET, RESET, HRESO) constituting edge information.

Figure 4:
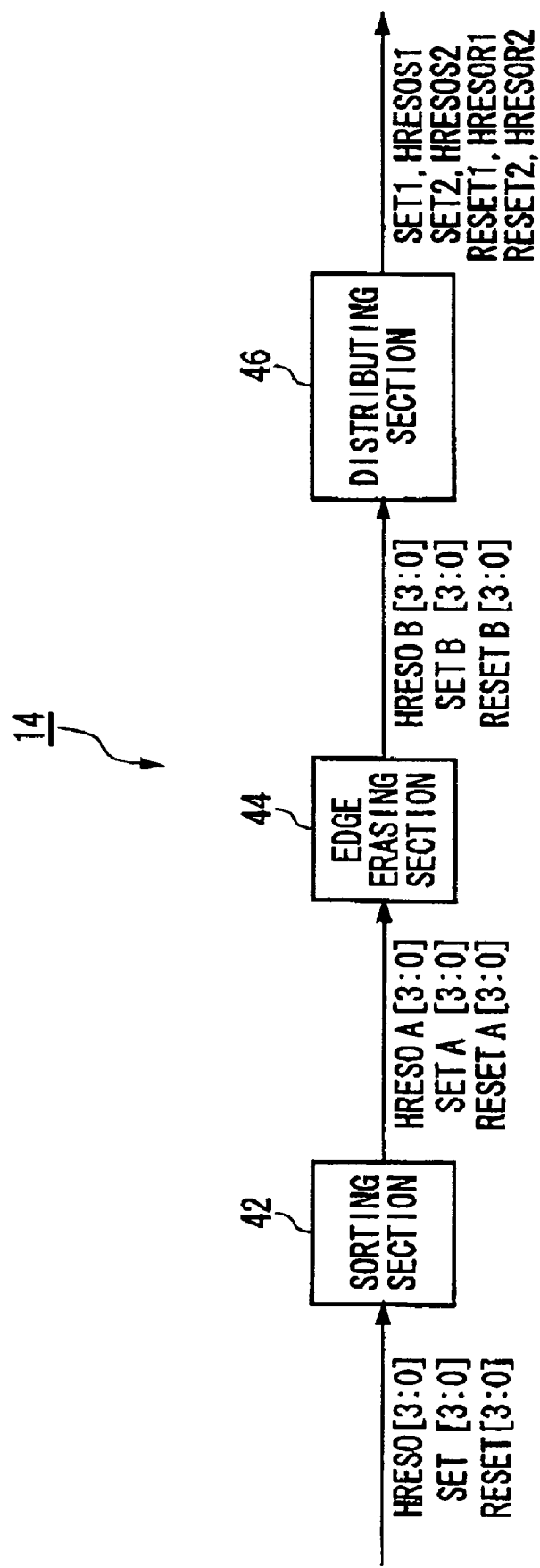
FIG. 4 is a view showing a concrete configuration of a selecting section.

FIG. 4 is a view showing a concrete configuration of the selecting section 14. The selecting section 14 has a sorting section 42, an edge erasing section 44, and a distributing section 46. The sorting section 42 sorts a plurality of edges to be generated during the reference clock period in time sequence generating the edges. The edge erasing section 44 detects and erases an unnecessary edge when rising edges continue, when falling edges continue, and when a rising edge and a falling edge simultaneously occur. In other words, when the test apparatus supplies a test pattern instructing that a rising edge is further generated in a state that a test signal is a high level or when the test apparatus supplies a test pattern instructing that a falling edge is further generated in a state that a test signal is a low level, the edge erasing section 44 masks the rising edge or the falling edge so as not to generate these edges.

The distributing section 46 distributes which edge generator within the waveform shaping section 16 generates each edge included in the reference clock period. At this time, the distributing section 46 selects that the first set-side edge generator 21 or the second set-side edge generator 22 different from each other generates two or more rising edges to be generated during the reference clock period, and at the same time selects that the first reset-side edge generator 23 or the second reset-side edge generator 24 different from each other generates two or more falling edges to be generated during the reference clock period. Then, the distributing section 46 outputs edge generation flags (SET1, SET2, RESET1, RESET2) and delay time information (HRESOS1, HRESOS2, HRESOR1, HRESOR2) to each of the selected edge generators.

According to the selecting section 14, when the same kind of edge is generated during the reference clock period, since these edges are assigned to edge generators different from one another, it is possible to reduce the generation of proximity restriction violation for edges. In addition, in the present specification, edge information after being sorted by the sorting section 42 in order of time is expressed with SETA [3:0], RESETA [3:0], and HRESOA [3:0]. In the present specification, edge information after the edge erasing section 44 erases unnecessary edges is expressed with SETB [3:0], RESETB [3:0], and HRESOB [3:0].

Figure 5:
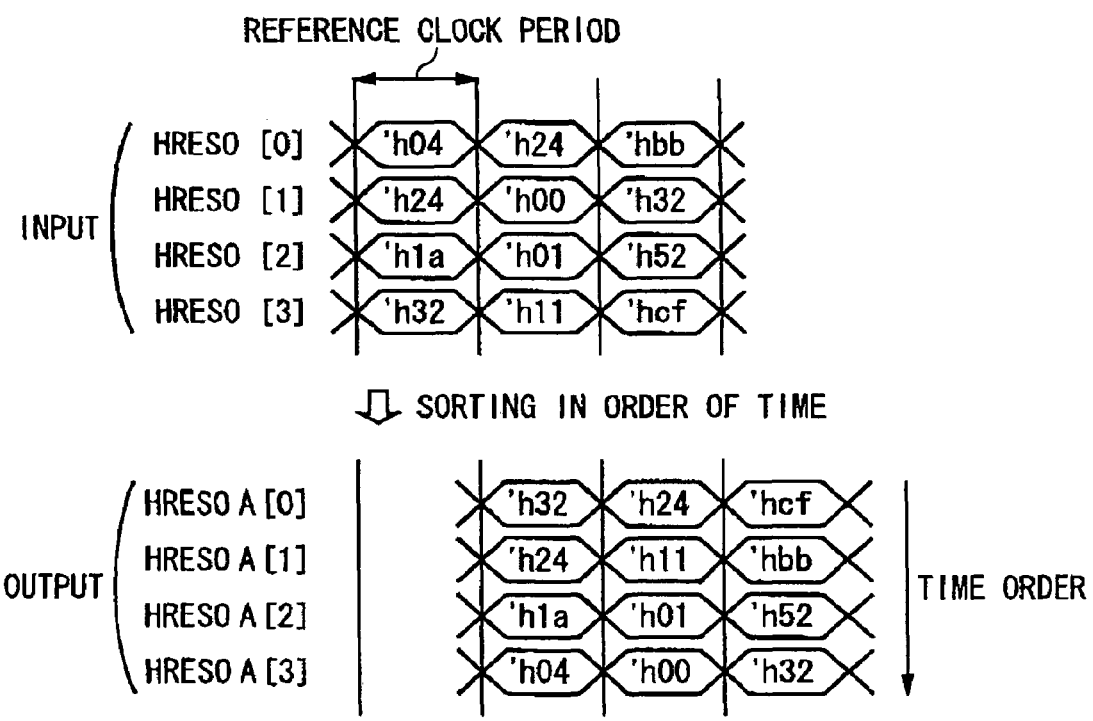
FIG. 5 is a view showing edge information input into a sorting section and edge information output from the sorting section.

FIG. 5 is a view showing edge information input into the sorting section 42 and edge information output from the sorting section 42. As shown in FIG. 5, the sorting section 42 refers to values of four delay time information (HRESO [0], HRESO [1], HRESO [2], and HRESO [3]) among edge information being input for each reference clock period, and sorts the arrangement for these values in order of time. In other words, the sorting section 42 sorts the arrangement in a sequence generating edges. Furthermore, the sorting section 42 similarly sorts rising edge position information (SET [3:0]) and falling edge position information (RESET [3:0]) in conjunction with delay time information (HRESO [3:0]). In addition, when four delay time information data have the same value, the sequence has no preference.

According to the sorting section 42, although arrangement for each edge in one edge information is rotated when converting a test pattern shown for each test period into edge information for each reference clock period, since edges in the reference clock period are sorted according to time, the handling of edge information after that becomes easy.

Figure 6:
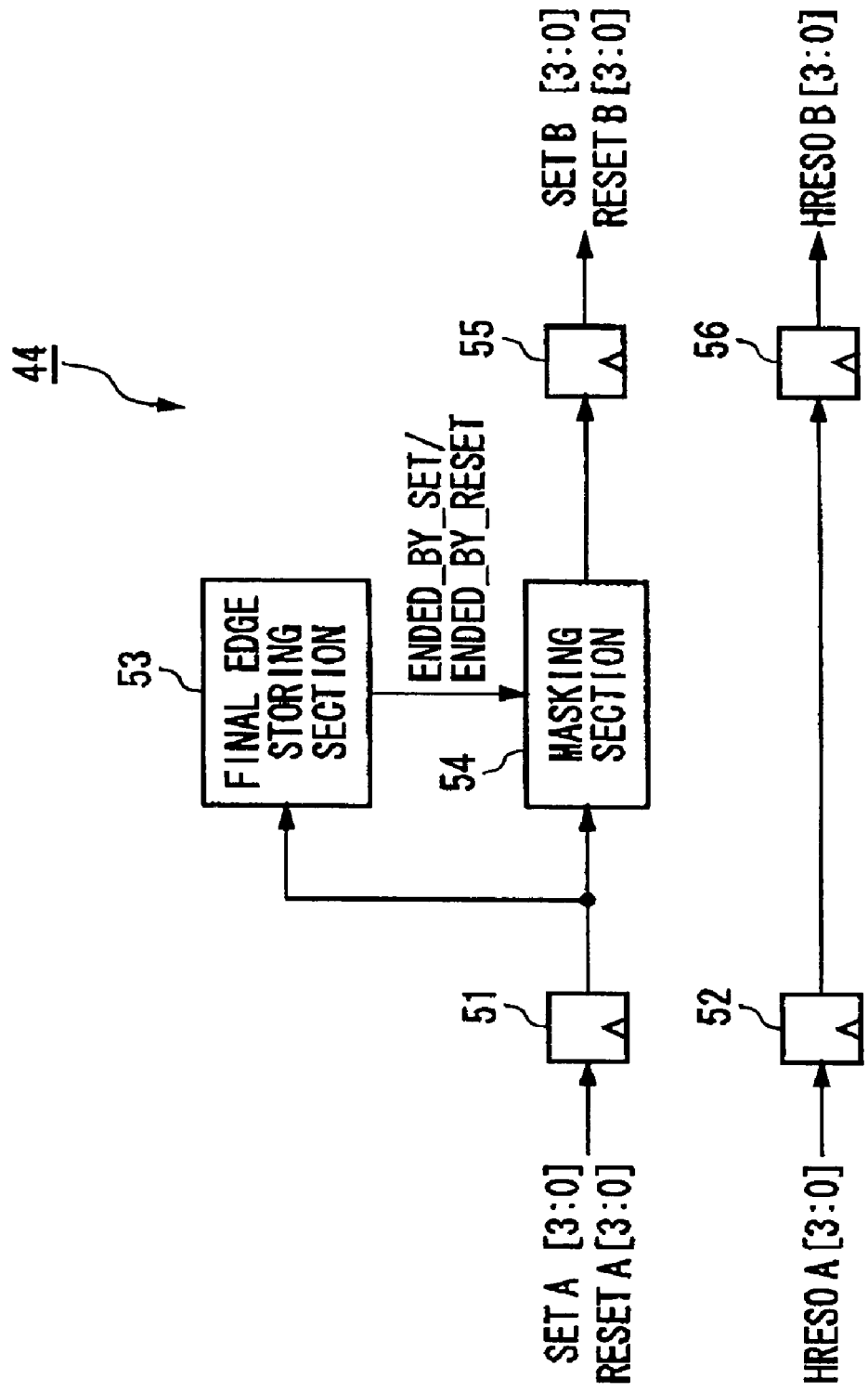
FIG. 6 is a view showing a concrete configuration of an edge erasing section.

FIG. 6 is a view showing a concrete configuration of the edge erasing section 44. The edge erasing section 44 includes a second flip-flop 51, a third flip-flop 52, a final edge storing section 53, a masking section 54, a fourth flip-flop 55, and a fifth flip-flop 56. The final edge storing section 53 receives rising and falling edge position information (SETA [3:0] and RESETA [3:0]) stored on the second flip-flop 51, and stores just precedent edge information showing whether a final edge in a just precedent reference clock period was a rising edge (ENDED_BY_SET) or a falling edge (ENDED_BY_RESET).

The masking section 54 inputs rising and falling edge position information (SETA [3:0] and RESETA [3:0]) stored on the second flip-flop 51 and just precedent edge information from the final edge storing section 53. Then, the masking section 54 detects an unnecessary edge based on the information, and masks the detected unnecessary edge so as not to be generated. The fourth flip-flop 55 stores the rising edge position information (SETA [3:0]) and the falling edge position information (RESETA [3:0]) after being masked by the masking section 54. The fifth flip-flop 56 stores the delay time information (HRESOA [3:0]) stored on the third flip-flop 52 as it is. Then, the edge erasing section 44 outputs the information stored on the fourth flip-flop 55 and the fifth flip-flop 56 to the distributing section 46. As described above, according to the edge erasing section 44, since an edge generator does not perform an unnecessary operation by erasing an unnecessary edge, it is possible to prevent the generation of proximity restriction violation according to the output of unnecessary edge.

FIG. 7 is a view showing a translation table for erasing unnecessary edges referred to by the final edge storing section 53 when a final edge in a just precedent reference clock period is a rising edge (ENDET_BY_SET). FIG. 8 is a view showing a translation table for erasing unnecessary edges referred to by the final edge storing section 53 when the final edge in a just precedent reference clock period is a falling edge (ENDET_BY_RESET).

The translation tables shown in FIGS. 7 and 8 show an input pattern with four edges included in one reference clock period and an output pattern with edges after unnecessary edges corresponding to this input pattern are deleted. In addition, these translation tables show that a rising edge is "s", a falling edge is "R", no edge is "N", the case when a rising edge is not (the case of R or N) is "!S", and the case when a falling edge is not (the case of S or N) is "!R". The masking section 54 selects one table according to whether a just precedent edge is a rising edge or a falling edge. Then, the masking section 54 converts bits according to the selected table. At this time, the masking section 54 converts bits so as to have high priority as described on the table. In this manner, since the translation table is referred to, it is possible to simply erase an unnecessary edge.

Figure 9:
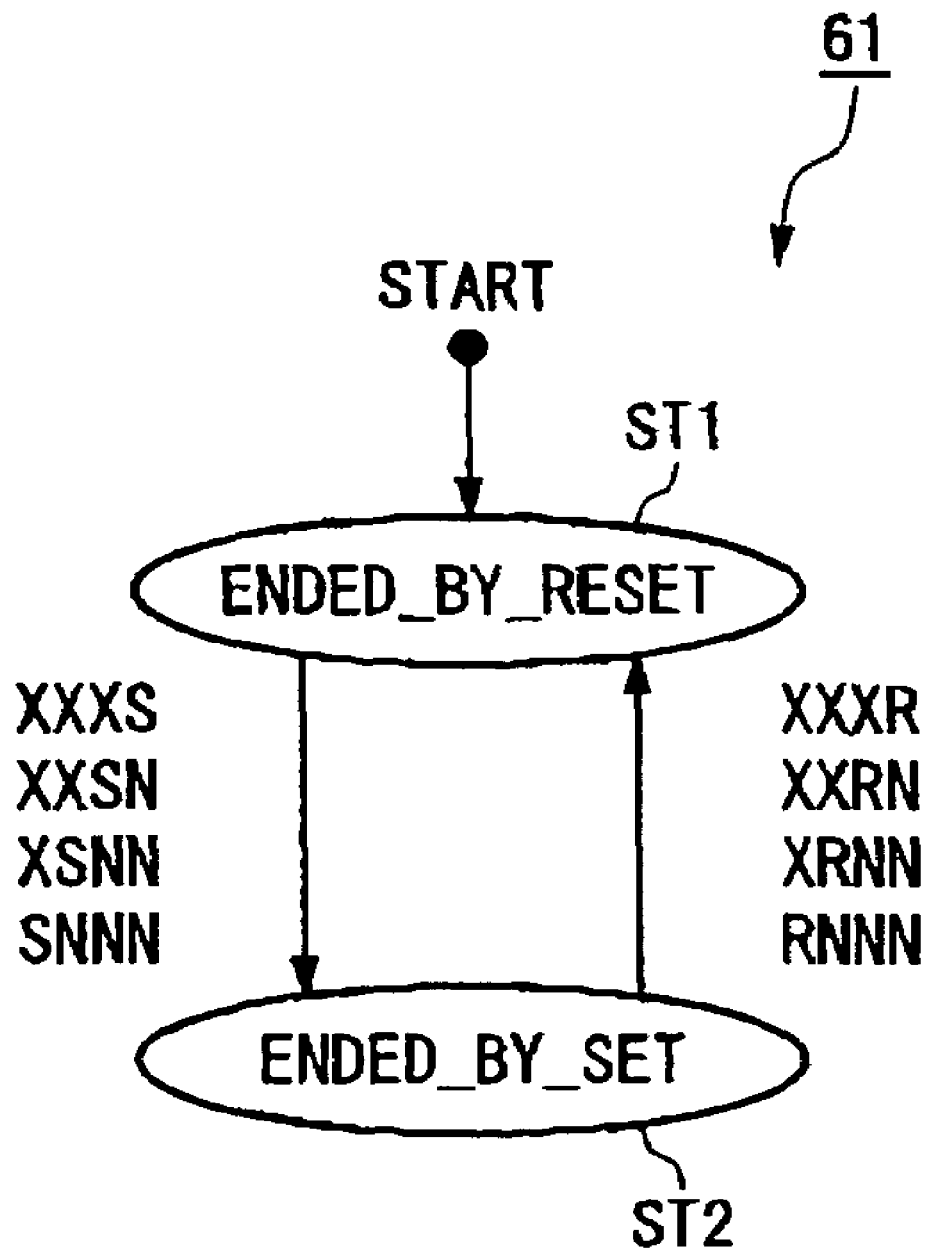
FIG. 9 is a view showing a state machine as an example of a final edge storing section.

FIG. 9 is a view showing a state machine 61 as an example of the final edge storing section 53. As an example, the final edge storing section 53 has a state machine 61 including ENDED_BY_RESET state ST1 and ENDED_BY_SET state ST2. The ENDED_BY_RESET state ST1 shows a state that a final edge was a falling edge. The ENDED_BY_SET state ST2 shows a state that a final edge in a just precedent reference clock period was a rising edge.

When an operation starts, the state machine 61 first transits to the ENDED_BY_RESET state ST1. The state machine 61 transits to the ENDED_BY_SET state ST2 when the final edge in the reference clock period becomes a rising edge (S) in a state of ENDED_BY_RESET state ST1. Moreover, the state machine 61 transits to the ENDED_BY_SET state ST2 when the final edge in the reference clock period becomes a falling edge (R) in a state of ENDED_BY_SET state ST2. In this manner, since the state machine 61 is used, it is possible to extremely simply store a final edge.

Figure 10:
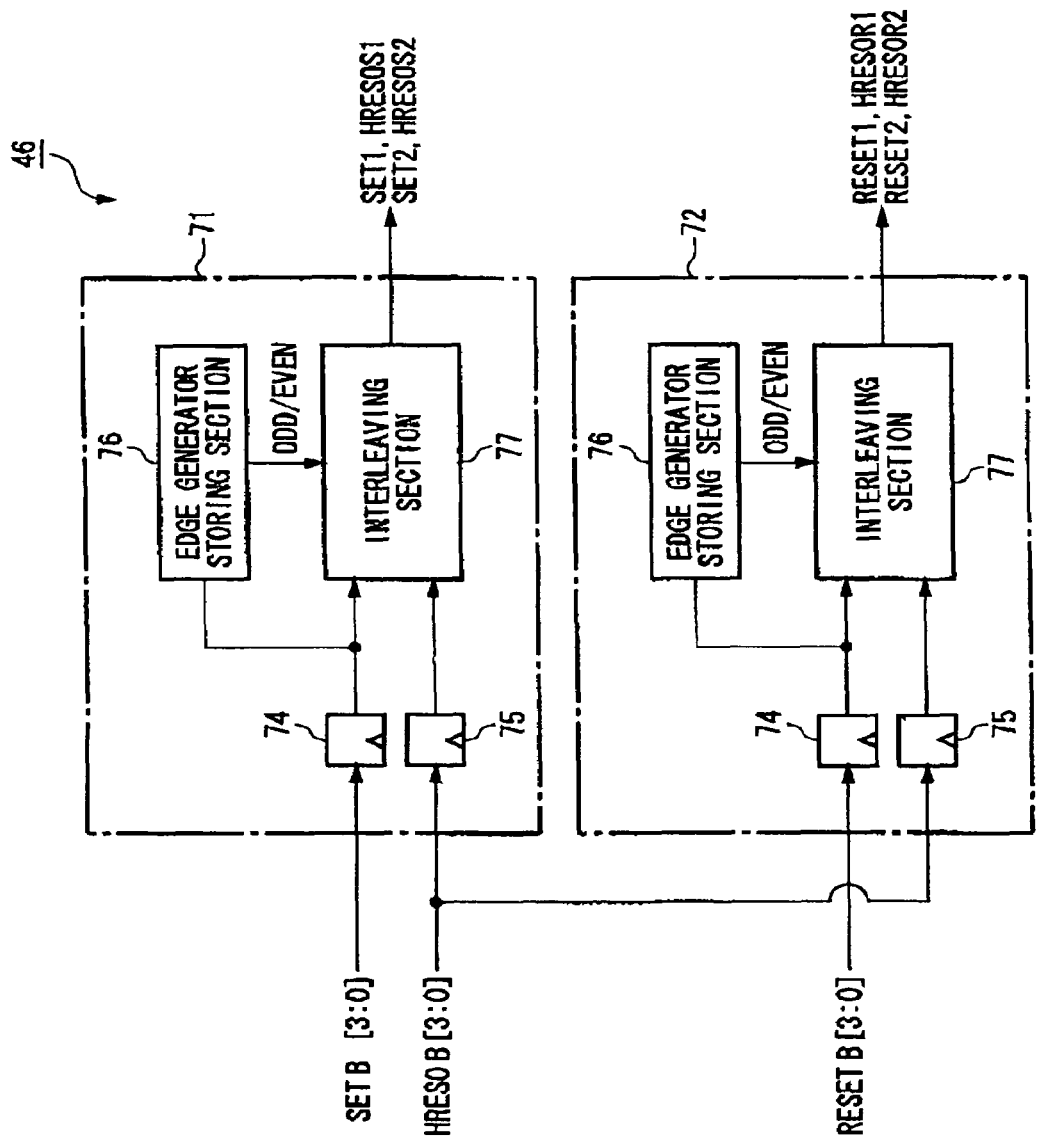
FIG. 10 is a view showing a concrete configuration of a distributing section.

FIG. 10 is a view showing a concrete configuration of the distributing section 46. The distributing section 46 includes a set-side distributing section 71 and a reset-side distributing section 72. The set-side distributing section 71 inputs the rising edge position information (SETB [3:0]) and the delay time information (HRESOB [3:0]) for each reference clock period, and outputs set-side edge generation flags (SET1 and SET2) and delay time information (HRESOS1 and HRESOS2).

The reset-side distributing section 72 inputs the falling edge position information (RESETB [3:0]) and the delay time information (HRESOB [3:0]) for each reference clock period, and outputs reset-side edge generation flags (RESET1 and RESET2) and delay time information (HRESOR1 and HRESOR2). In addition, since the set-side distributing section 71 and the reset-side distributing section 72 have the same internal configuration even if the handled information such as rising edge position information (SETB [3:0]) or falling edge information (RESET [3:0]) is different, the descriptions for the reset-side distributing section 72 will be omitted.

The set-side distributing section 71 has a sixth flip-flop 74, a seventh flip-flop 75, an edge generator storing section 76, and an interleaving section 77. The edge generator storing section 76 stores an edge generator for finally generating an edge in a just precedent reference clock period, and refers to the rising edge position information (SETB [3:0]) stored on the sixth flip-flop 74 to update the stored edge generator. Specifically, the edge generator storing section 76 stores whether an edge generator for finally generating a rising edge in a just precedent reference clock period is the first set-side edge generator 21 or the second set-side edge generator 22.

The interleaving section 77 refers to the edge position information (SETB [3:0]) of the sixth flip-flop 74 and the delay time information (HRESOB [3:0]) of the seventh flip-flop 75, and generates edge generation flags (SET1 and SET2) and delay time information (HRESOS1 and HRESOS2). At this time, the interleaving section 77 selects an edge generator different from the edge generator stored on the edge generator storing section 76 so as to generate an initial rising edge in the current reference clock period, and also selects edge generators different from one another so as to generate edges when two or more rising edges are generated during the reference clock period.

Figures 11A, 11B:
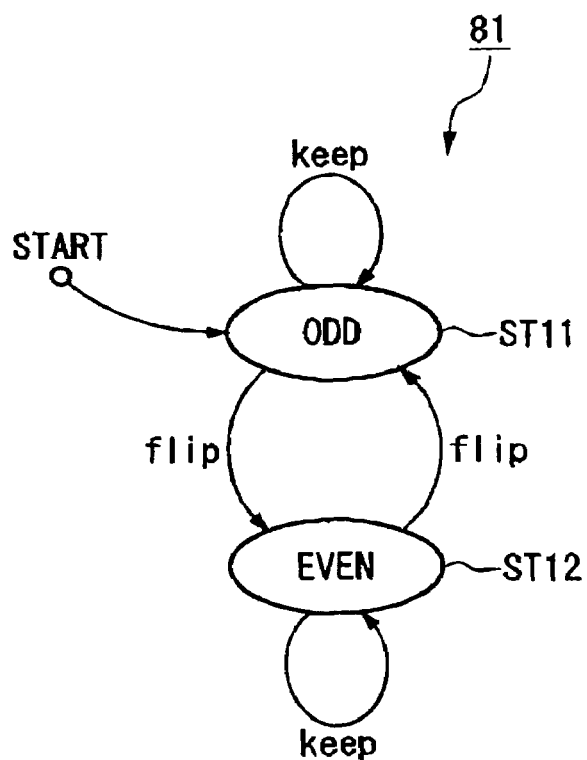
FIG. 11A is a view showing a state machine included in an edge generator storing section and FIG. 11B is a view showing a condition of state transition of this state machine.

FIG. 11A is a view showing a state machine 81 included in the edge generator storing section 76. FIG. 11B is a view showing a condition of state transition of this state machine 81. This state machine 81 shows an edge generator having a transition state for finally generating an edge in a just precedent reference clock period. As an example, the edge generator storing section 76 has the state machine 81 including an ODD state ST11 and an EVEN state ST12. The ODD state ST11 shows a state that a test pattern in a just precedent reference clock period generates odd-number rising edges. The EVEN state ST12 shows a state that a test pattern in a just precedent reference clock period generates even-number rising edges.

When an operation starts, the state machine 81 first transits to the ODD state ST11. The state machine 81 transits to the EVEN state ST12 in case of a test pattern generating odd-number rising edges in a state of the ODD state ST11 (flip), and remains in the ODD state ST11 in case of the other states (keep). Moreover, the state machine 81 transits to the ODD state ST11 in case of a test pattern generating odd-number rising edges in a state of the EVEN state ST12 (flip), and remains in the EVEN state ST12 in case of the other states (keep).

The edge generator storing section 76 having such a state machine 81 stores an edge generator different from the edge generator stored in the just precedent reference clock period in case of the ODD state ST11, and holds a state storing the edge generator stored in the just precedent reference clock period in case of the EVEN state ST12. In this manner, since the state machine 81 is used, it is possible to extremely simply store a just precedent edge generator.

Figure 12:
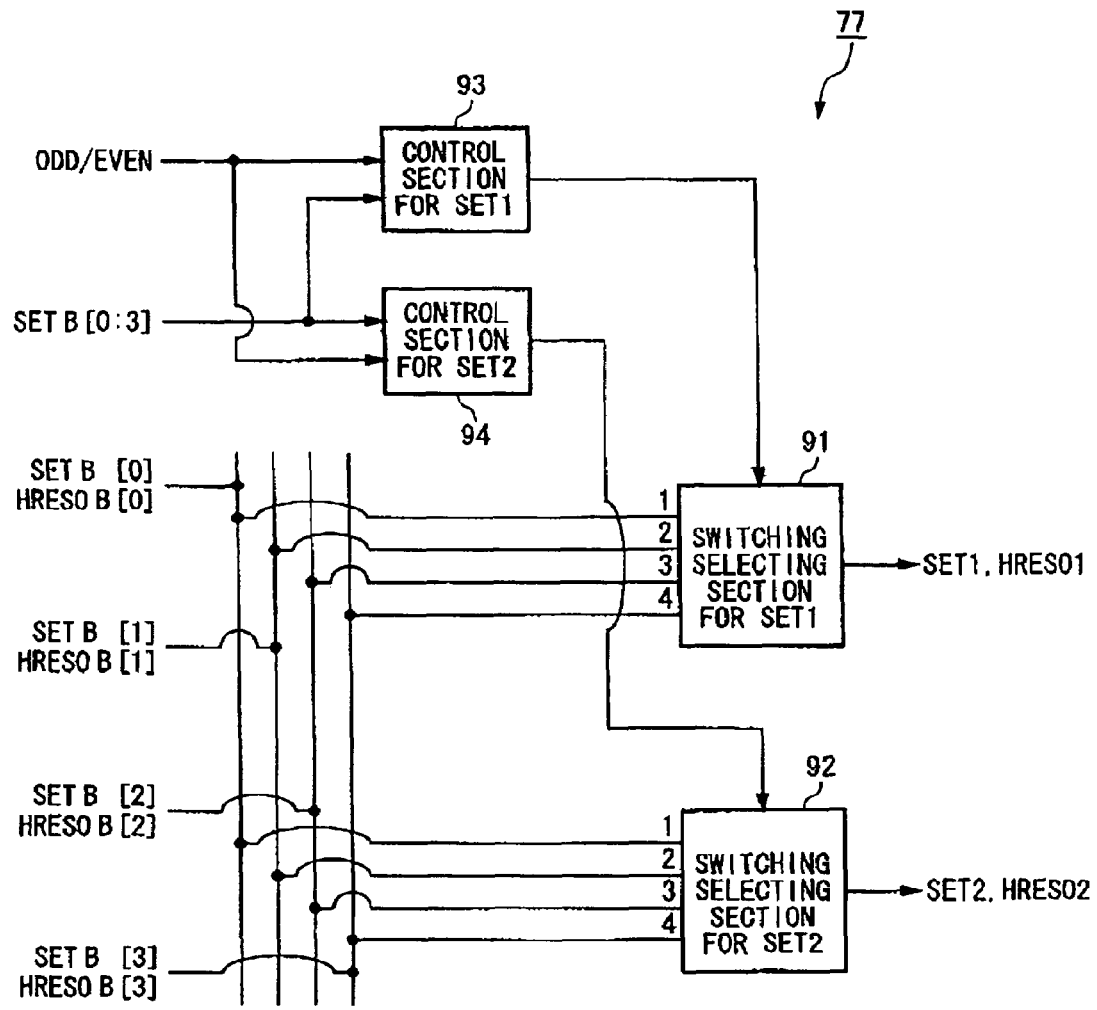
FIG. 12 is a view showing a circuit configuration as an example of an interleaving section.

FIG. 12 is a view showing a circuit configuration as an example of the interleaving section 77. As an example, the interleaving section 77 has a switching selecting section for SET1 91, a switching selecting section for SET2 92, a control section for SET1 93, and a control section for SET2 94. In the switching selecting section for SET1 91 and the switching selecting section for SET2 92, the first rising edge position information (SETB [0]) and delay time information (HRESOB [0]) are input to a first input terminal, the second rising edge position information (SETB [1]) and delay time information (HRESOB [1]) are input to a second input terminal, the third rising edge position information (SETB [2]) and delay time information (HRESOB [2]) are input to a third input terminal, and the fourth rising edge position information (SETB [3]) and delay time information (HRESOB [3]) are input to a fourth input terminal.

The switching selecting section for SET1 91 selects any one of the information input to the four input terminals according to an instruction from the control section for SET1 93, and outputs the selected information as the edge generation flag (SET1) and the delay time information (HRESOS1) to be supplied to the first set-side edge generator 21. The switching selecting section for SET2 92 selects any one of the information input to the four input terminals according to an instruction from the control section for SET2 94, and outputs the selected information as the edge generation flag (SET2) and the delay time information (HRESOS2) to be supplied to the second set-side edge generator 22.

The control section for SET1 93 and the control section for SET2 94 control the switching of input terminals of the switching selecting section for SET1 91 and the switching selecting section for SET2 92 according to the state (the ODD state ST11 or the EVEN state ST12) of the state machine 81 and the rising edge position information (SETB [3:0]).

FIG. 13 is a table showing an input terminal selected by the switching selecting section for SET1 91 and the switching selecting section for SET2 92 in case of the ODD state ST11. FIG. 14 is a table showing an input terminal selected by the switching selecting section for SET1 91 and the switching selecting section for SET2 92 in case of the EVEN state ST12. The input terminals for edge patterns to be input are shown in the tables shown in FIGS. 13 and 14. The control section for SET1 93 and the control section for SET2 94 control an input terminal selected by the switching selecting section for SET1 91 with reference to the table shown in FIG. 13 in case of the ODD state ST11. The control section for SET1 93 and the control section for SET2 94 control an input terminal selected by the switching selecting section for SET2 92 with reference to the table shown in FIG. 14 in case of the EVEN state ST12.

Referring to the tables in FIGS. 13 and 14, in the case of the same edge pattern, the first set-side edge generator 21 and the second set-side edge generator 22 are replaced with each other in the case of ODD state ST11 and EVEN state ST12. For this reason, since the first set-side edge generator 21 and the second set-side edge generator 22 are controlled according to this table, edges can be alternately generated even if what kind of edge pattern is generated. Therefore, according to the test apparatus 10, it is possible to surely generate a test signal without violating proximity restriction that the same edge generator continuously generates an edge two times within one reference rate period.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A test apparatus for testing a device under test, comprising:
   a test pattern generating section that generates a test pattern to test the device under test every test period;
   a plurality of edge generators that respectively generate an edge of a test signal to be supplied to the device under test based on the test pattern every cycle period of a reference clock that is used as a reference for an operation of this test apparatus;
   a selecting section that selects which edge generator generates each edge of a test signal to be output during the next cycle period based on a pattern of the edge generated during the current cycle period; and
   a test signal supplying section that supplies the test signal according to each edge generated from the selected edge generator to the device under test,
   wherein the selecting section comprises:
      a storing section that stores the edge generator for finally generating an edge during the current cycle period; and
      an interleaving section that selects the edge generator different from the edge generator stored on the storing section so that the different edge generator generates an initial edge during the next cycle period.

2. The test apparatus as claimed in claim 1, wherein the selecting section selects the edge generators so that the edge generators different from one another respectively generate two or more edges to be generated within the cycle period of the reference clock.

3. test apparatus as claimed in claim 1, wherein
   the selecting section further comprises a sorting section that sorts a plurality of edges to be generated within the cycle period in time sequence to be generated, and
   the interleaving section assigns the edge generators that should generate each edge in a predetermined order in sequence from the next edge generator of the edge generator stored on the storing section.

4. The test apparatus as claimed in claim 1, wherein
   the test apparatus comprises the two edge generators for generating one edge every test period, the selecting section makes the storing section store the edge generator different from the edge generator stored on the storing section during the just precedent cycle period when odd-number edges are generated from the test pattern during the current cycle period, and
   the selecting section holds a state in which the edge generator stored on the storing section during the just precedent cycle period is stored on the storing section when even-number edges are generated from the test pattern during the current cycle period.

5. The test apparatus as claimed in claim 1, wherein the test apparatus further comprises:
   a plurality of set-side edge generators that respectively generate a rising edge for the test signal every cycle period;
   a plurality of reset-side edge generators that respectively generate a falling edge for the test signal every cycle period; and
   an edge erasing section that masks a rising edge or a falling edge so as not to generate this edge when a test pattern instructing that a rising edge is further generated in a high-level state of the test signal is supplied or when a test pattern instructing that a falling edge is further generated in a low-level state of the test signal is supplied, and the selecting section selects which edge generator generates each edge that should be output during the next cycle period and is not masked.

6. The test apparatus as claimed in claim 5, wherein the edge erasing section masks a rising edge and a falling edge so as not to generate these edges when a test pattern instructing that both this rising edge and this falling edge are generated at the same timing is supplied.

7. A test method for testing a device under test, comprising:
- a test pattern generating step of generating a test pattern to test the device under test every test period;
- an edge generating step of respectively generating an edge of a test signal to be supplied to the device under test based on the test pattern by a plurality of edge generators every cycle period of a reference clock that is used as a reference for an operation of the test apparatus;
- a selecting step of selecting which edge generator generates each edge of a test signal to be output during the next cycle period based on a pattern of the edge generated during the current cycle period; and
- a test signal supplying step of supplying the test signal according to each edge generated from the selected edge generator to the device under test, wherein the selecting step further comprising:
- storing the edge generator for finally generating an edge during the current cycle period in a storing section; and
- selecting the edge generator different from the edge generator stored on the storing section so that the different edge generator generates an initial edge during the next cycle period.

* * * * *